US009171766B2

(12) United States Patent
    Baterna Marbella

(10) Patent No.: US 9,171,766 B2
(45) Date of Patent: Oct. 27, 2015

(54) LEAD FRAME STRIPS WITH SUPPORT MEMBERS

(71) Applicant: Infineon Technologies AG, Neubiberg (DE)

(72) Inventor: Carlo Baterna Marbella, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 134 days.

(21) Appl. No.: 13/886,407

(22) Filed: May 3, 2013

(65) Prior Publication Data

US 2014/0327004 A1    Nov. 6, 2014

(51) Int. Cl.
| | |
|---|---|
| H01L 21/66 | (2006.01) |
| H01L 23/495 | (2006.01) |
| H01L 21/48 | (2006.01) |
| H01L 23/31 | (2006.01) |
| H01L 21/56 | (2006.01) |
| H01L 23/00 | (2006.01) |

(52) U.S. Cl.
CPC .......... H01L 22/30 (2013.01); H01L 21/4842 (2013.01); H01L 22/14 (2013.01); H01L 22/32 (2013.01); H01L 23/49555 (2013.01); H01L 24/97 (2013.01); *H01L 21/565* (2013.01); *H01L 23/3107* (2013.01); *H01L 24/29* (2013.01); *H01L 24/32* (2013.01); *H01L 24/48* (2013.01); *H01L 24/73* (2013.01); *H01L 24/92* (2013.01); *H01L 2224/291* (2013.01); *H01L 2224/2919* (2013.01); *H01L 2224/32245* (2013.01); *H01L 2224/48247* (2013.01); *H01L 2224/48465* (2013.01); *H01L 2224/50* (2013.01); *H01L 2224/73263* (2013.01); *H01L 2224/73265* (2013.01); *H01L 2224/92246* (2013.01); *H01L 2224/92247* (2013.01); *H01L 2224/97* (2013.01)

(58) Field of Classification Search
CPC ................. H01L 2924/00014; H01L 2924/00; H01L 2224/48247; H01L 2924/00012; H01L 2224/73265
USPC ............................. 438/14; 257/48, 666, 670
See application file for complete search history.

(56) References Cited

U.S. PATENT DOCUMENTS

| | | | | |
|---|---|---|---|---|
| 6,541,846 B2 * | 4/2003 | Vaiyapuri | ..................... | 257/676 |
| 2008/0265248 A1 * | 10/2008 | Drwinga et al. | ................ | 257/48 |

OTHER PUBLICATIONS

Author Unknown. "Strip Test Service Sheet." Amkor Technology, Oct. 2012. pp. 1.

\* cited by examiner

*Primary Examiner* — Andy Huynh
(74) *Attorney, Agent, or Firm* — Murphy, Bilak & Homiller, PLLC

(57) ABSTRACT

A lead frame strip includes a plurality of connected unit lead frames. Each unit lead frame has a die paddle for attaching to a semiconductor die, a tie bar connecting the die paddle to a periphery of the unit lead frame, and a plurality of leads projecting from the periphery toward the die paddle. The lead frame strip further includes a support member patterned into or connected to the periphery of each unit lead frame at a proximal end and bent into a different plane than the leads so that a distal end of each support member is disposed above or below the leads and projects toward the die paddles. The distal end of the support members can be anchored in a mold compound encapsulating electronic components attached to the die paddles, to maintain structural integrity during lead frame strip testing prior to unit lead frame separation.

20 Claims, 8 Drawing Sheets

LEAD FRAME STRIPS WITH SUPPORT MEMBERS

TECHNICAL FIELD

The instant application relates to lead frame strips, and more particularly support members for maintaining structural integrity during lead frame strip testing.

BACKGROUND

A lead frame forms the base or skeleton of an IC package, providing mechanical support to semiconductor dies during assembly into a finished package. A lead frame typically includes a die paddle for attaching a semiconductor die, and leads providing the means for external electrical connection to the die. The die can be connected to the leads by wires, e.g. through wire bonding or tape automated bonds. Lead frames are typically constructed from flat sheet metal, e.g. by stamping or etching. The sheet metal is typically exposed to chemical etchants that remove areas not covered by photoresist. After the etching process, the etched frames are singulated (separated) into lead frame strips. Each lead frame strip includes a number of unit lead frames each having the die paddle and lead construction described above.

Semiconductor dies attached to the die paddles after completion of the assembly process of a lead frame strip are usually tested after separation of the unit lead frames from the lead frame strip, e.g. by punching. Alternatively, the unit lead frames remain mechanically connected to the lead frame strip by tie bars during die testing. This is commonly referred to as lead frame strip testing. Separation of the unit lead frames from the lead frame strip occurs after electrical testing. The die paddles remain electrically connected to the lead frame strip by the tie bars during testing. This is problematic for applications where the die paddles serve an electrical connection function, e.g. in DSO (dual small outline) packages where the exposed die paddles provide an electrical connection to the backside of semiconductor dies attached to the die paddles. In this case, the tie bars electrically short the die paddles to the lead frame strip and to the other die paddles attached to the same lead frame strip, complicating the electrical testing process.

SUMMARY

According to embodiments described herein, a lead frame strip is provided which comprises a plurality of connected unit lead frames. Each unit lead frame has a die paddle for attaching to a semiconductor die, a tie bar connecting the die paddle to a periphery of the unit lead frame, and a plurality of leads projecting from the periphery toward the die paddle. The lead frame strip further comprises a support member patterned into or connected to the periphery of each unit lead frame at a proximal end. The support members are bent into a different plane than the leads so that a distal end of each support member is disposed above or below the leads and projects toward the die paddles. The distal end of the support members can be anchored in a mold compound encapsulating electronic components attached to the die paddles. The support members maintain structural integrity of the lead frame strip after the tie bars are detached from the die paddles, to enable reliable lead frame strip testing which occurs prior to separation of the unit lead frames from the lead frame strip.

According to an embodiment of a method of testing electronic components attached to the lead frame strip, the method comprises: attaching a semiconductor die to each of the die paddles; bending the support members into a different plane than the leads so that a distal end of each support member is disposed above or below the leads and projects toward the die paddles; encapsulating the unit lead frames with a mold compound so that the distal end of each support member is anchored in the mold compound and part of the tie bars remains uncovered by the mold compound; detaching the tie bars from the die paddles outside the mold compound so that the support members hold the unit lead frames in place and the semiconductor dies are electrically isolated from the lead frame strip; testing the semiconductor dies after detaching the tie bars from the die paddles; and separating the unit lead frames after testing the semiconductor dies.

According to an embodiment of a semiconductor strip assembly comprising the lead frame strip and support members, the assembly further comprises a semiconductor die attached to each of the die paddles, and a mold compound that at least partly encapsulates the unit lead frames so that the distal end of each support member is anchored in the mold compound and part of the tie bars remains uncovered by the mold compound. The tie bars are detached from the periphery of the unit lead frames outside the mold compound so that the support members hold the unit lead frames in place and the semiconductor dies are electrically isolated from the lead frame strip, e.g. during strip testing.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

Embodiments described herein provide a lead frame strip comprising a plurality of connected unit lead frames. Each unit lead frame is designed to accommodate a semiconductor die. The unit lead frames are later separated from the lead frame strip into individual units after die attach, and later lead frame strip testing. The lead frame strip further includes a support member patterned into or connected to the periphery of each unit lead frame at a proximal end. The support members are bent into a different plane than the leads so that a distal end of each support member is disposed above or below the leads and projects toward the die paddles. The distal end of the support members can be anchored in a mold compound which encapsulates electronic components attached to the die paddles of the unit lead frames, so that structural integrity of the lead frame strip is maintained during lead frame strip testing (prior to separation of the unit lead frames).

Figure 1:
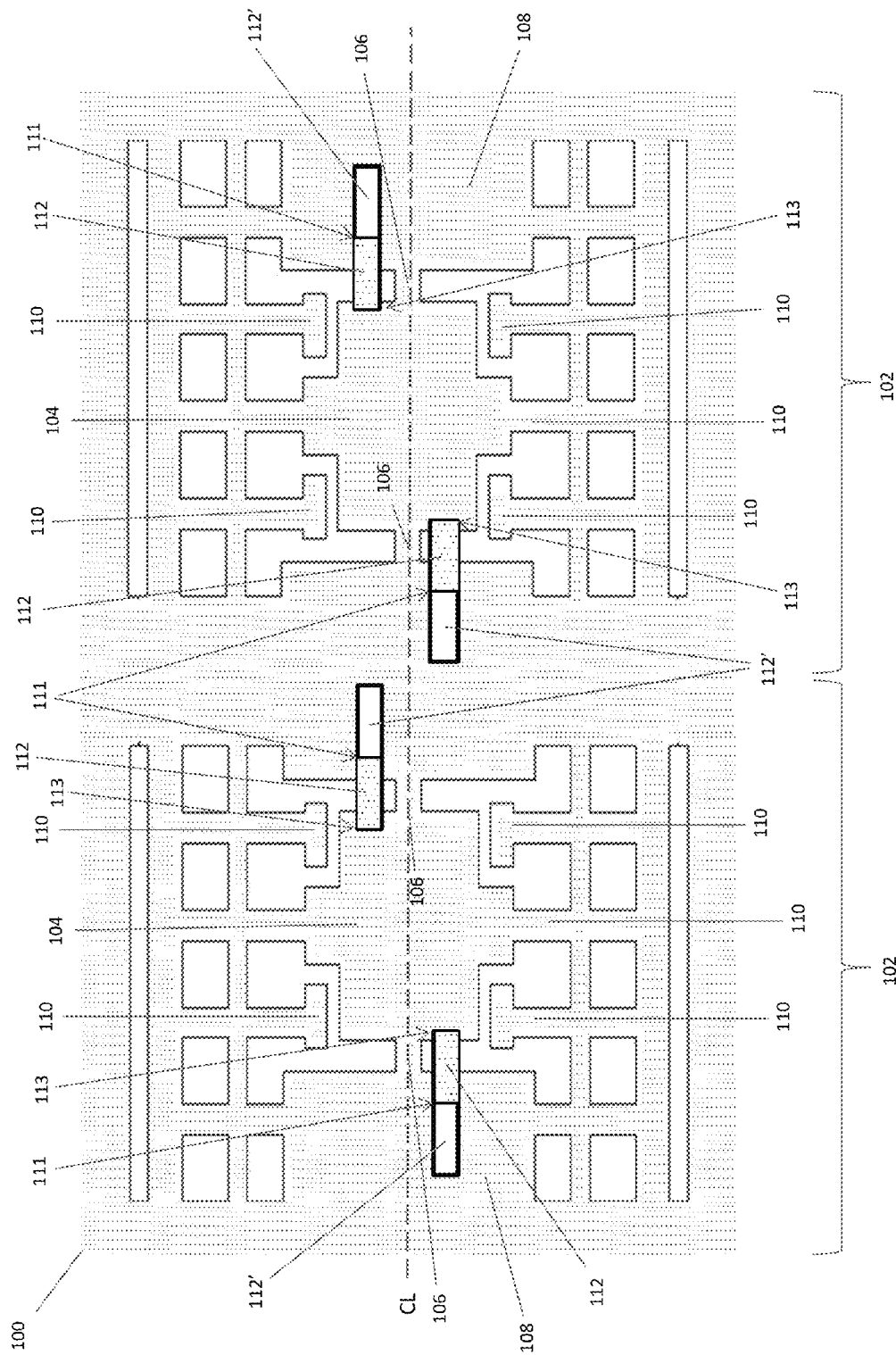
FIG. 1 illustrates a top-down plan view of a lead frame strip with support members according to an embodiment.

FIG. 1 illustrates a top-down plan view of part of a lead frame strip 100 according to an embodiment. The lead frame strip 100 includes a plurality of connected unit lead frames 102, two of which are shown in FIG. 1. Each unit lead frame 102 has a die paddle 104 for attaching to a semiconductor die, a tie bar 106 connecting the die paddle 104 to a periphery 108 of the unit lead frame 102, and a plurality of leads 110 projecting from the periphery 108 toward the die paddle 104.

The lead frame strip 100 further includes a support member 112 patterned into or connected to the periphery 108 of each unit lead frame 102 at a proximal end 111. The support members 112 can comprise the same or different material as the lead frame strip 100. For example, the support members 112 can have the same CTE (coefficient of thermal expansion) and material finish as the tie bars 106, die paddles 104, and leads 110, providing similar thermal cycling stress characteristics and/or interface and adhesion characteristics due to the material commonality.

The support members 112 can also be spaced apart from the die paddles 104 and leads 110. For example, the support members 112 can be spatially disposed on a different plane than the tie bars 108, leads 110 and/or die paddles 104. With such a configuration, the support members 112 do not compete for the same planar space as the tie bars 106, leads 110 and die paddles 104, permitting size maximization of the die paddles 104 and leads 110. Also, the support members 112 do not compete for the adjacent lead frame metal around the periphery of the die paddles 104 with such a configuration. The support members 112 can be located farther away from the die paddles 104 where there is more available metal, enabling the design of wider support members 112 which provide stronger mechanical support for the lead frame strip 100 and avoiding competition for lead frame material around the die paddle periphery. The support members 112 can be coated with an electrical insulator or remain uncoated.

In one embodiment, the lead frame strip 100 is constructed from flat sheet metal, e.g. by stamping or etching. For example, the sheet metal can be exposed to chemical etchants that remove areas not covered by photoresist. Other processing can be performed, e.g. such as laser etching to pattern the sheet metal. After the patterning process, the patterned frames are singulated (separated) into lead frame strips 100. One such lead frame strip 100 is shown in FIG. 1. The support members 112 can be patterned into the sheet metal as part of the patterning process, and therefore the support members 112 are formed as a single continuous part of the lead frame strip 100. Alternatively, the support members 112 can be connected to the periphery of each unit lead frame 102 after the patterning process, e.g. by gluing, soldering, etc. In each case, the unit lead frames 102 each have a pair of support members 112 patterned into or connected to the periphery 108 of the unit lead frame 102 at opposing sides of the periphery 108 according to the embodiment illustrated in FIG. 1. Further according to the embodiment shown in FIG. 1, the pair of support members 112 patterned into or connected to the periphery 108 of each unit lead frame 102 are offset from one another with reference to the center line labeled 'CL' in FIG. 1. Alternatively, the pair of support members 112 patterned into or connected to the periphery 108 of each unit lead frame 102 can be aligned with one another other for each unit lead frame 102 or some combination of aligned and misaligned support member configurations can be provided for the lead frame strip 100.

Figure 2:
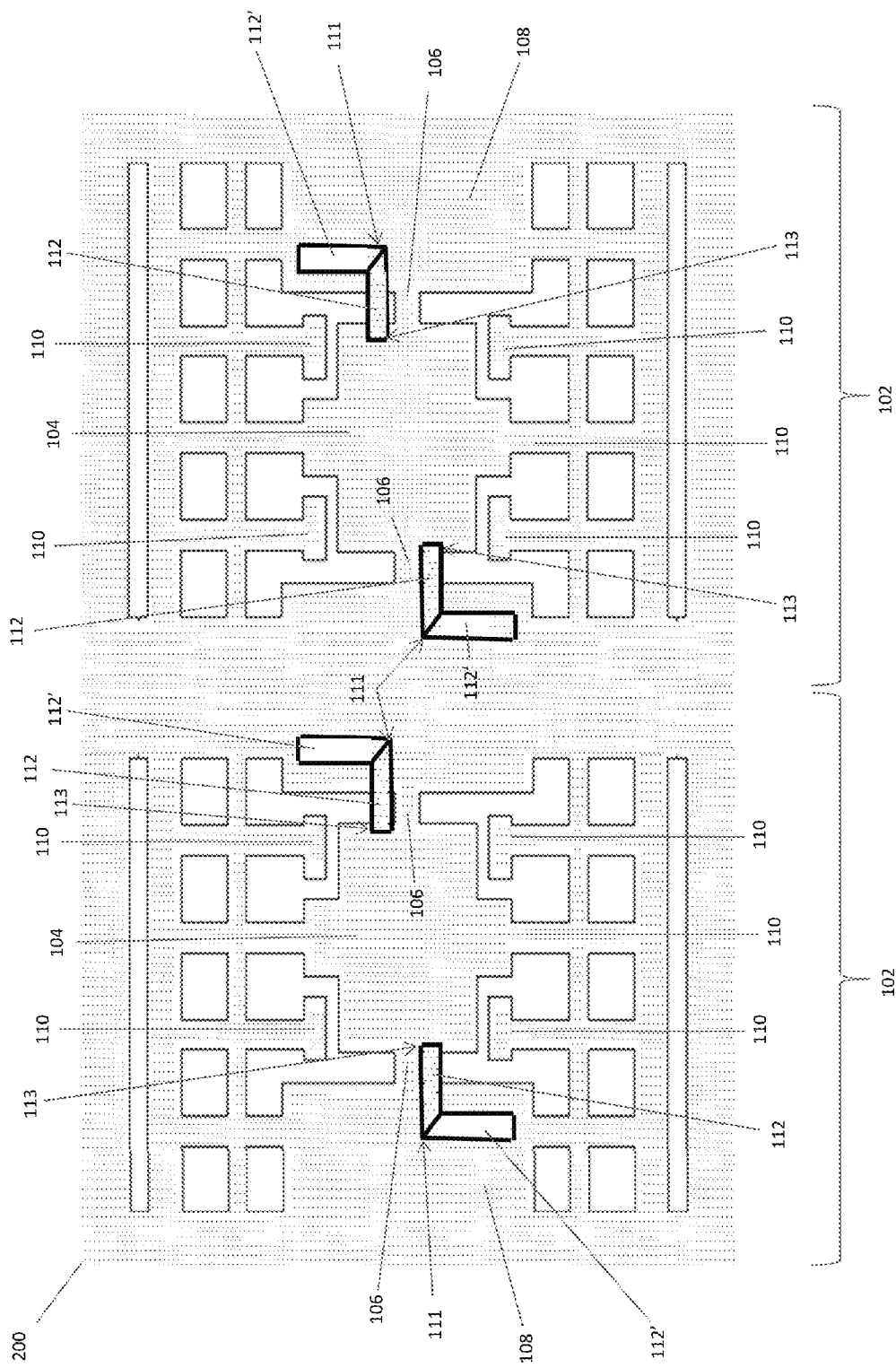
FIG. 2 illustrates a top-down plan view of a lead frame strip with support members according to another embodiment.

FIG. 2 illustrates a top-down plan view of part of a lead frame strip 200 according to another embodiment. The lead frame strip 200 shown in FIG. 2 is similar to the one shown in FIG. 1. However, the pair of support members 112 patterned into or connected to the periphery 108 of each unit lead frame 102 are bent in a first direction parallel with the corresponding die paddle 104 and then bent in a second direction perpendicular to the first direction and toward the corresponding die paddle 104.

Figure 3:
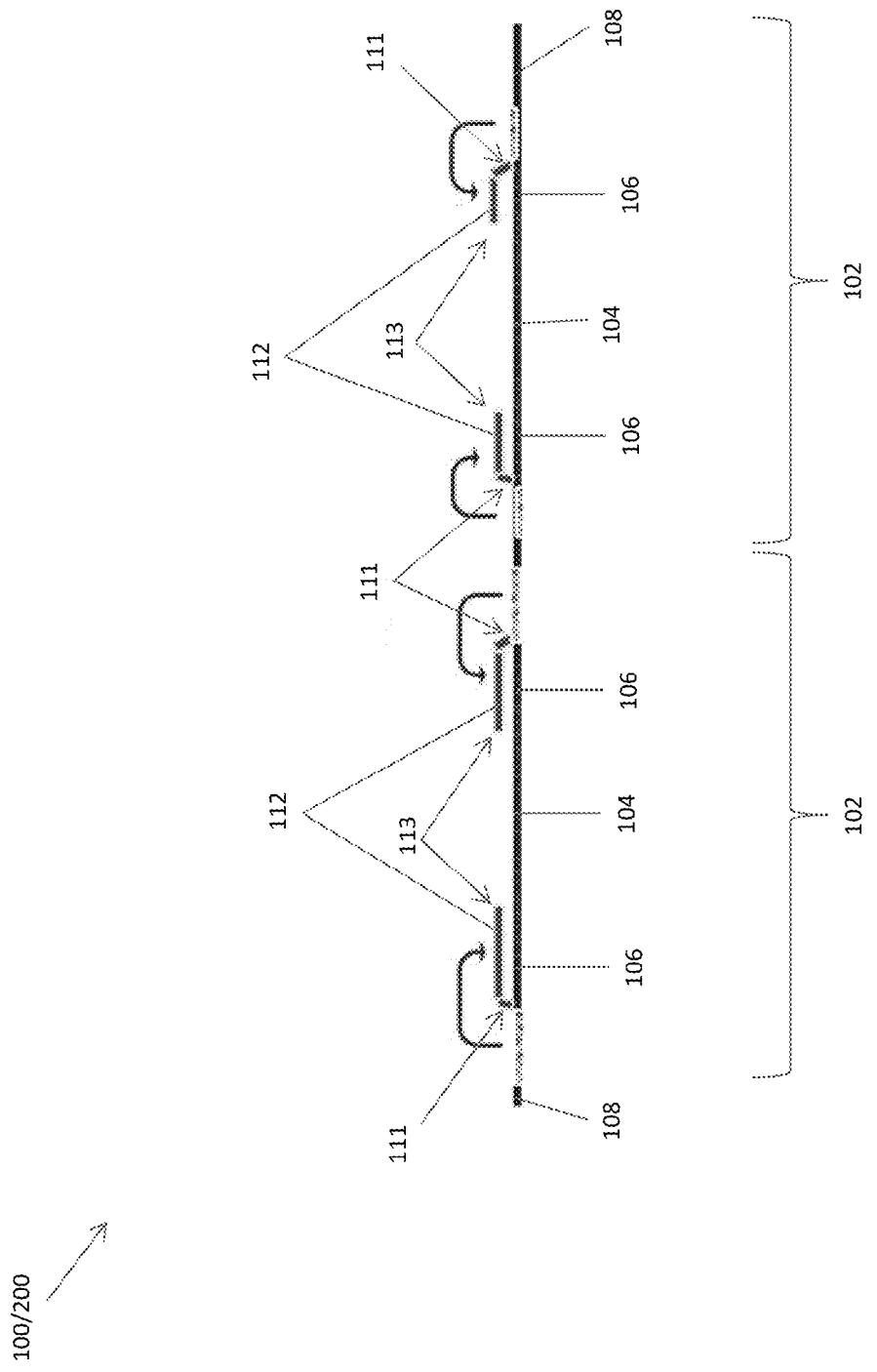
FIG. 3 illustrates a perspective cross-sectional view of a lead frame strip with support members, during bending of the support members.

FIG. 3 illustrates a cross-sectional view of a lead frame strip 100/200 after the support members 112 are bent into a different plane than the leads 110 and tie bars 106. The leads 110 are out of view in FIG. 3. The support member bending process is indicated by the curved arrows shown in FIG. 3. The support members 112 can be bent upward from the unit lead frame periphery 108 and toward the die paddles 104 as shown in FIG. 3. Alternatively, the support members 112 can be bent downward from the unit lead frame periphery 108 and toward the die paddles 104. In general, the distal end 113 of each support member 112 is disposed above or below the leads 110 and tie bars 106 and projects toward the die paddles 104. The proximal end 111 of the support members 112 remain connected to the periphery 108 of the corresponding unit lead frame 102. The support members 112 can be bent into a different plane than the leads 110 and toward the die paddles 104 before or after attachment of semiconductor dies to the die paddles 104. In FIGS. 1 and 2, the pre-bending position of the support members is indicated by reference number 112' and the post-bending position is indicated by reference number 112.

Figure 4:
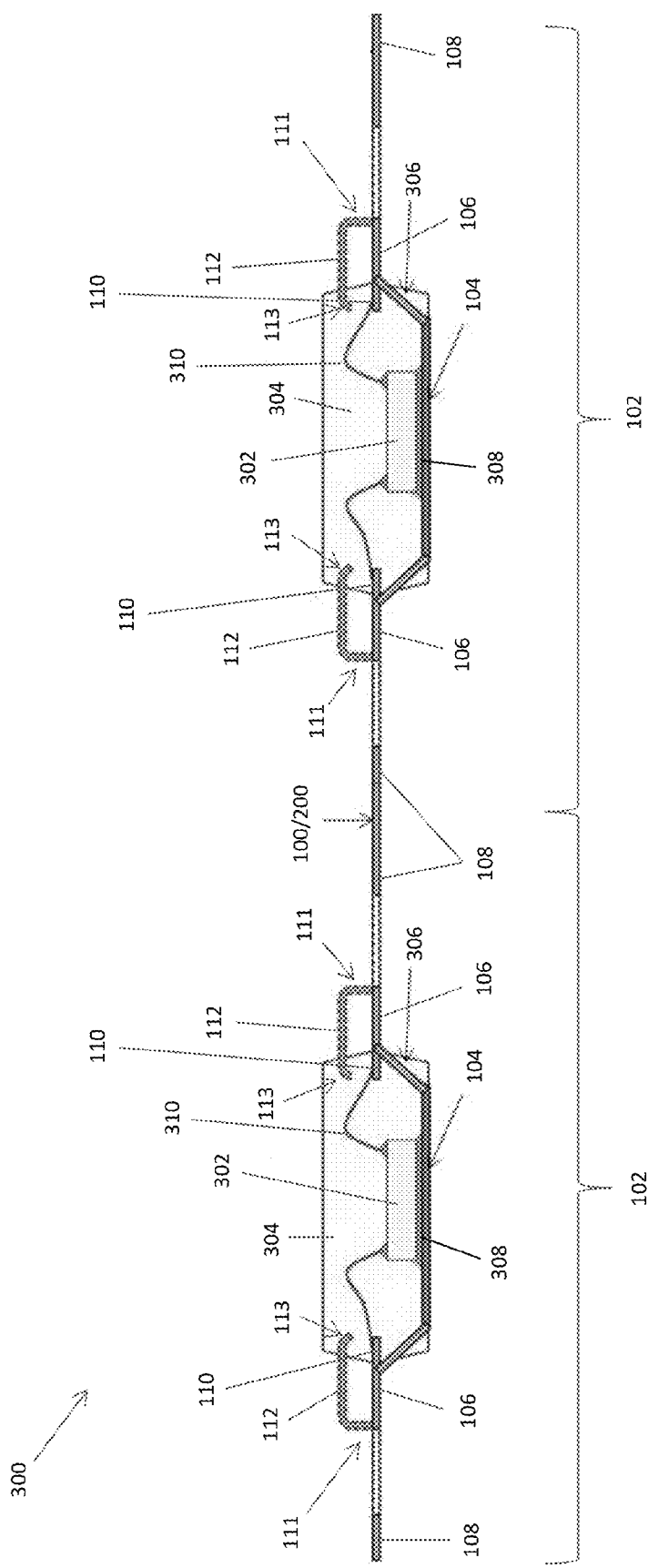
FIG. 4 illustrates a perspective cross-sectional view of a semiconductor strip assembly including a lead frame strip with a plurality of unit lead frames and support members, and encapsulated semiconductor dies attached to die paddles of the unit lead frames according to an embodiment.

FIG. 4 illustrates a cross-sectional view of a semiconductor strip assembly 300 after semiconductor dies 302 are attached to the die paddles 104 of a lead frame strip 100/200, and the unit lead frames 102 are at least partly encapsulated by a mold compound 304 such as an epoxy. The lead frame strip 100/200 has a downward extension 306 to the die paddles 104 according to this embodiment so that the die paddles 104 are positioned below the leads 110. The support members 112 are bent upward from the lead frame strip 100/200 and toward the die paddles 104 before encapsulation according to this embodiment so that the distal end 113 of each support member 112 is anchored in the mold compound 304 above the die paddles 104. The distal end 113 of the support members 112 can be bent downward toward the die paddles 104 as shown in FIG. 4 to better anchor the distal end 113 of the support members 112 in the mold compound 304.

The bottom side of the semiconductor dies 302 facing the die paddles 104 are attached to the die paddles 104 prior to encapsulation by the mold compound 304. In the case of a vertical-current device, the bottom side of the dies 302 has a terminal or pad and current flows vertically in the device between the top and bottom sides. According to this embodiment, the bottom side of the dies 302 are attached to the corresponding die paddles 104 by an electrically conductive material 308 such as solder. The bottom side of the die paddles 104 can remain exposed to form a contact pad for testing and normal operation of the corresponding semiconductor dies 302, i.e. to provide an external electrical connection to the terminal at the bottom side of the dies 302. In the case of a lateral-current device where all electrical device connections are made at the top side of the dies 302, the bottom side of the dies 302 can be glued or otherwise attached to the die paddles 104 using an electrically insulating material 308 such as glue or epoxy. Terminals or pads at the top side of the semiconductor dies 302 can be connected to the corresponding leads 110 by wires 310, e.g. through wire bonding or tape automated bonds.

After the encapsulation process, the distal end 113 of each support member 112 is anchored in the mold compound 304 encapsulating the corresponding semiconductor die 302. Such a configuration maintains the structural integrity of the lead frame strip 100/200 during subsequent lead frame strip testing (prior to separation of the unit lead frames 102), as described next with reference to FIG. 5.

Figure 5:
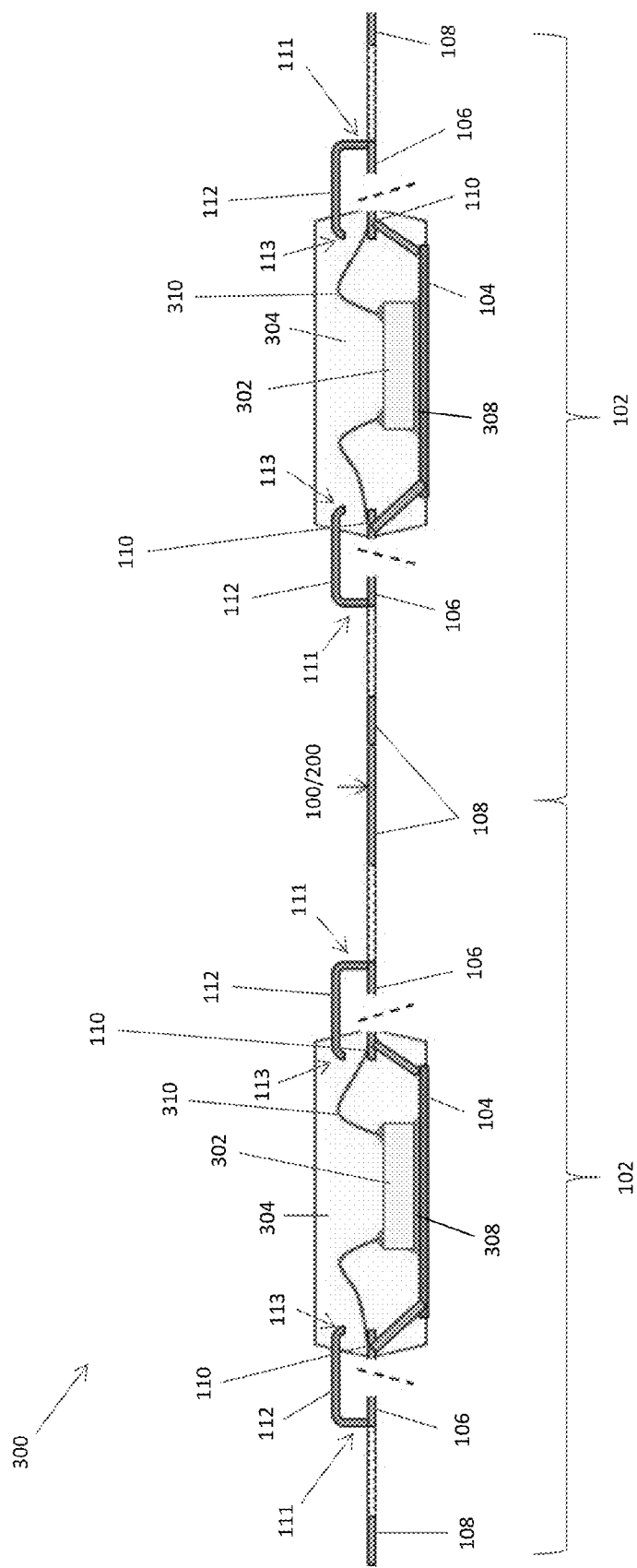
FIG. 5 illustrates a perspective cross-sectional view of the semiconductor strip assembly of FIG. 4 after the tie bars are detached from the die paddles.

FIG. 5 shows a cross-sectional view of the semiconductor strip assembly 300 of FIG. 4 after the tie bars 106 holding the die paddles 104 to the periphery 108 of the unit lead frames 102 are severed or cut outside the mold compound 304. The tie bar severing/cutting process is represented by angled dashed lines in FIG. 5. The semiconductor dies 302 are electrically isolated from the lead frame strip 100/200 after the tie bars 106 are detached from the periphery 108 of the unit lead frames 102. The support members 112 hold the unit lead frames 102 in place during subsequent testing of the dies 302 (prior to separation of the unit lead frames 102).

Figure 6:
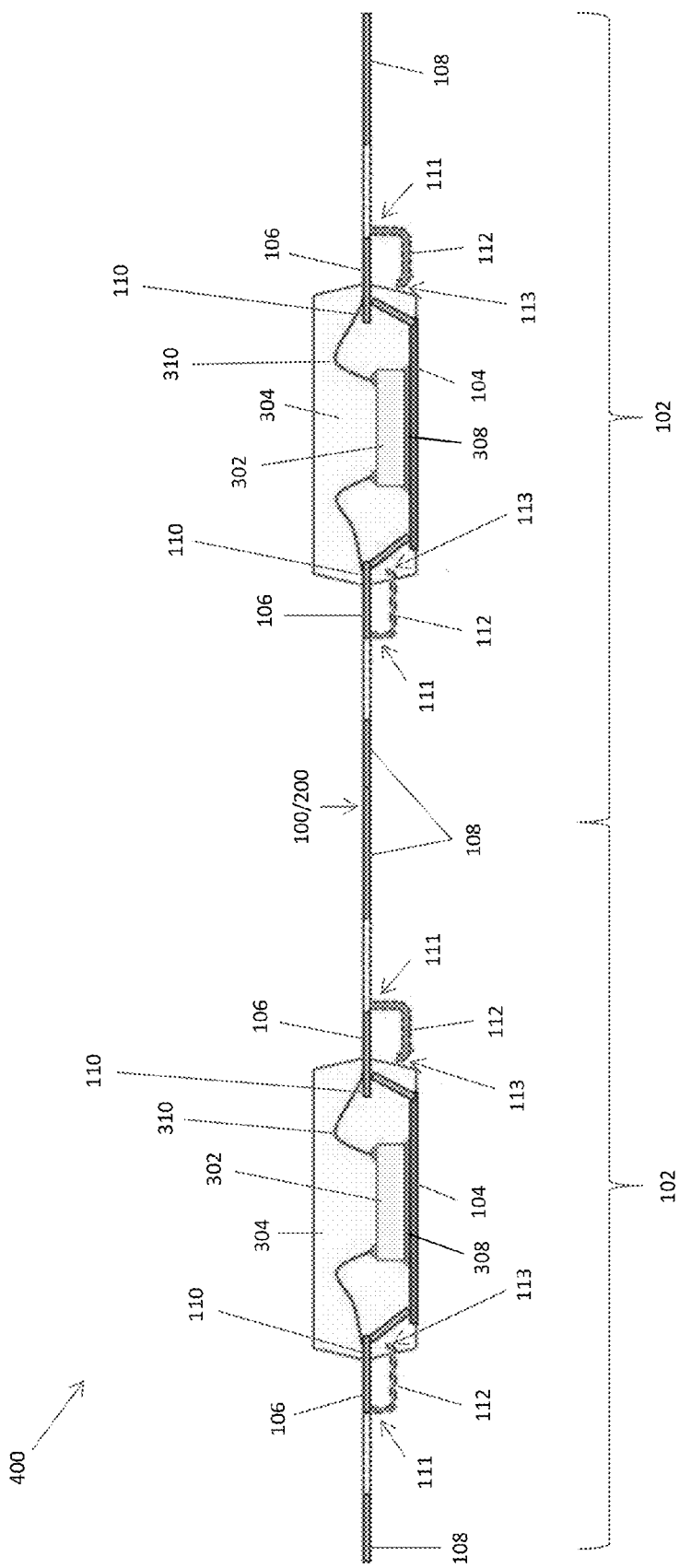
FIG. 6 illustrates a perspective cross-sectional view of a semiconductor strip assembly including a lead frame strip with a plurality of unit lead frames and support members, and encapsulated semiconductor dies attached to die paddles of the unit lead frames according to another embodiment.

FIG. 6 illustrates a cross-sectional view of another embodiment of a semiconductor strip assembly 400 after semiconductor dies 302 are attached to the die paddles 104 of a lead frame strip 100/200, and the unit lead frames 102 are at least partly encapsulated by a mold compound 304 such as an epoxy. The semiconductor strip assembly 400 shown in FIG. 6 is similar to the one shown in FIG. 4, however, the support members 112 are bent downward instead of upward from the lead frame strip 100/200 and toward the die paddles 104 before encapsulation. According to this embodiment, the distal end 113 of each support member 112 is anchored in the mold compound 304 below the die paddles 104 after the encapsulation process. The distal end 113 of the support members 112 can be bent upward toward the die paddles 104 as shown in FIG. 6 to better anchor the distal end 104 of the support members 112 in the mold compound 304. The configuration shown in FIG. 6, like the one illustrated in FIG. 4, maintains the structural integrity of the lead frame strip 100/200 during subsequent lead frame strip testing (prior to separation of the unit lead frames 102), as described next with reference to FIG. 7.

Figure 7:
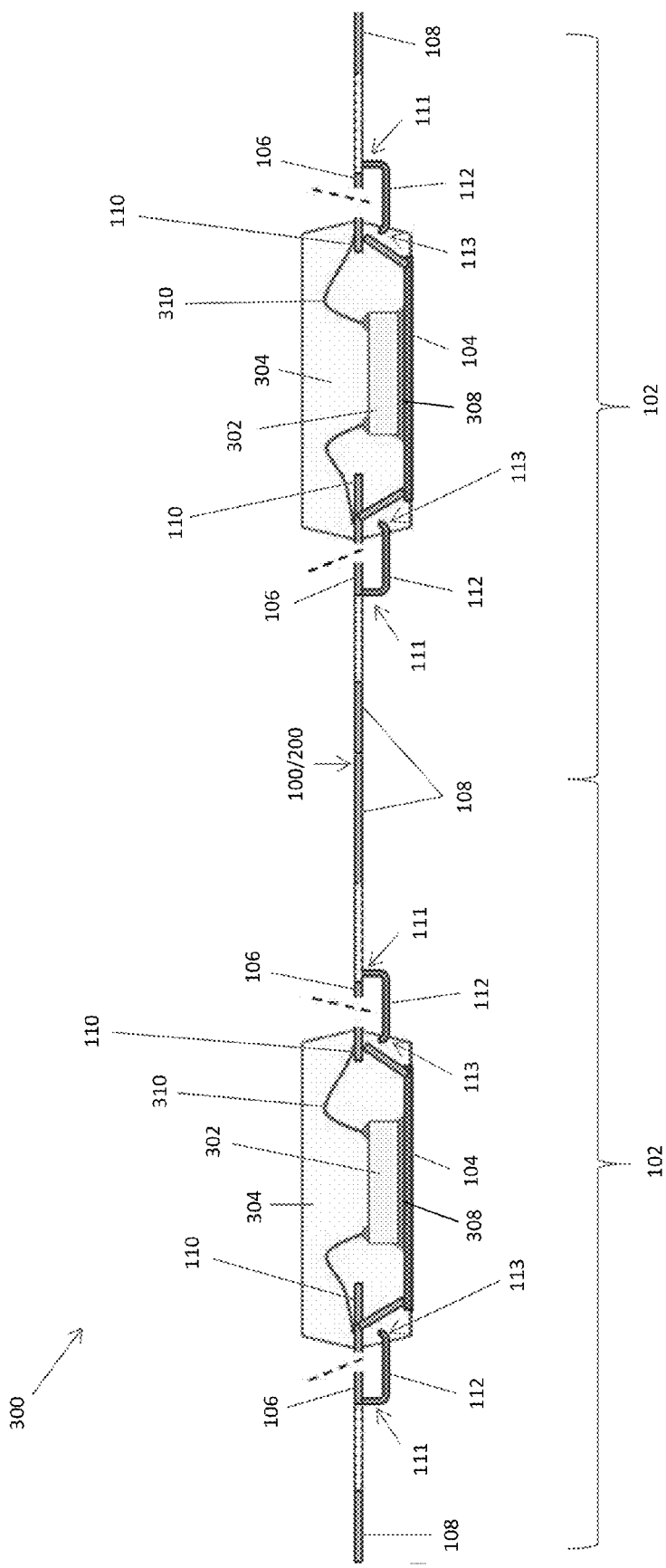
FIG. 7 illustrates a perspective cross-sectional view of the semiconductor strip assembly of FIG. 6 after the tie bars are detached from the die paddles.

FIG. 7 shows a cross-sectional view of the semiconductor strip assembly of FIG. 6 after the tie bars 106 holding the die paddles 104 to the periphery 108 of the unit lead frames 102 are severed or cut outside the mold compound 304. The tie bar severing/cutting process is represented by angled dashed lines in FIG. 7. The tie bars 106 are severed/cut above the support members 112 according to this embodiment. The semiconductor dies 302 are electrically isolated from the lead frame strip 100/200 after the tie bars 106 are detached from the periphery 108 of the unit lead frames 102, and the support members 112 hold the unit lead frames 102 in place during subsequent testing of the dies 302 (prior to separation of the unit lead frames 102) as previously described herein.

Figure 8:
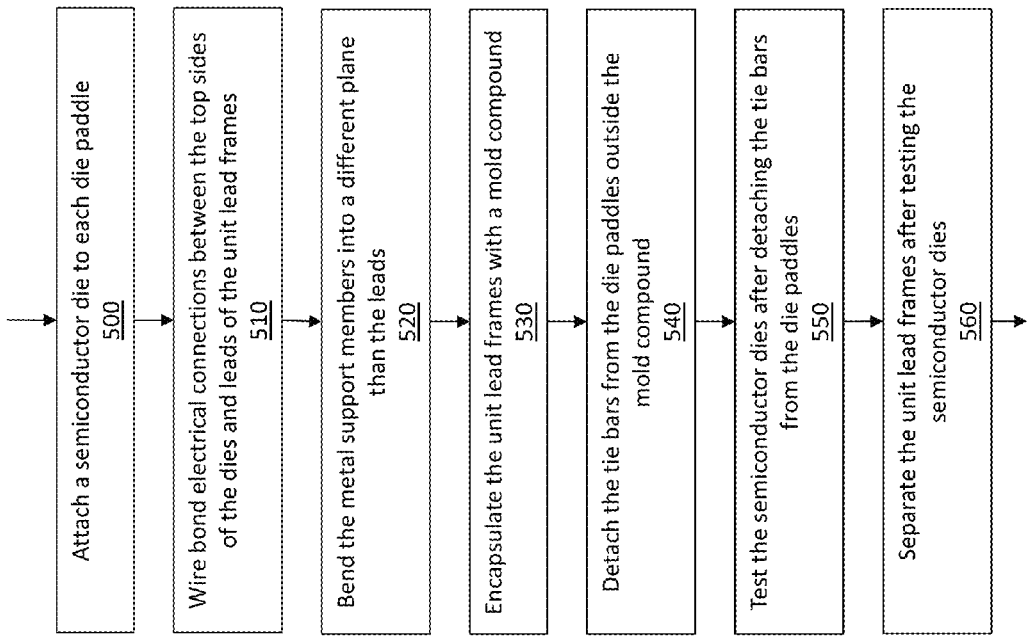
FIG. 8 illustrates a flow diagram of an embodiment of a method of testing electronic components attached to unit lead frames of a lead frame strip having support members.

FIG. 8 illustrates an embodiment of a method of testing electronic components attached to a lead frame strip that includes a plurality of connected unit lead frames and support members as previously described herein. The method comprises attaching a semiconductor die to the die paddles of the unit lead frames (Block 500) and wire bonding electrical connections between the top sides of the dies and corresponding leads of the unit lead frames (Block 510). The support members are bent into a different plane than the leads before or after the die attach and/or bonding processes, so that a distal end of each support member is disposed above or below the leads and projects toward the die paddles (Block 520). Optionally the lead frame support member bending or manufacture/preparation can be performed at the lead frame vendor, followed by the die assembly process (Steps 500 and 510). In each case, the unit lead frames are encapsulated with a mold compound so that the distal end of each support member is anchored in the mold compound and part of the tie bars remains uncovered by the mold compound (Block 530). The tie bars are detached from the die paddles outside the mold compound so that the support members hold the unit lead frames in place and the semiconductor dies are electrically isolated from the lead frame strip (Block 540). The semiconductor dies are tested after the tie bars are detached from the die paddles (Block 550). The unit lead frames are separated from the lead frame strip after the semiconductor dies are tested (Block 560). The method can optionally include coating the support members with an electrical insulator prior to encapsulating the unit lead frames with the mold compound. The support members can be formed by stamping or etching the lead frame strip, or by attaching the support members to the lead frame strip, e.g. by soldering or gluing as previously described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of testing electronic components attached to a lead frame strip including a plurality of connected unit lead frames, each unit lead frame having a die paddle, a tie bar connecting the die paddle to a periphery of the unit lead frame, a plurality of leads projecting from the periphery toward the die paddle, and a support member patterned into or connected to the periphery at a proximal end, the method comprising:

attaching a semiconductor die to each of the die paddles;

bending the support members into a different plane than the leads so that a distal end of each support member is disposed above or below the leads and projects toward the die paddles, the support members being permanently electrically disconnected from the semiconductor dies;

encapsulating the unit lead frames with a mold compound so that the distal end of each support member is anchored in the mold compound and part of the tie bars remains uncovered by the mold compound;

detaching the tie bars from the die paddles outside the mold compound so that the support members hold the unit lead frames in place and the semiconductor dies are electrically isolated from the lead frame strip;

testing the semiconductor dies after detaching the tie bars from the die paddles; and separating the unit lead frames after testing the semiconductor dies.

2. The method of claim 1, comprising bending the support members above the leads and the distal ends of the support members downward toward the die paddles.

3. The method of claim 1, comprising bending the support members below the leads and the distal ends of the support members upward toward the die paddles.

4. The method of claim 1, wherein the support members comprise the same material as the lead frame strip.

5. The method of claim 1, wherein the support members are formed as a single continuous part of the lead frame strip.

6. The method of claim 1, further comprising coating the support members with an electrical insulator prior to encapsulating the unit lead frames with the mold compound.

7. The method of claim 1, wherein the support members are spaced apart from the die paddles and the leads after being bent into a different plane than the leads.

8. The method of claim 1, further comprising forming the support members by stamping or etching the lead frame strip.

9. A semiconductor strip assembly, comprising:
a lead frame strip including a plurality of connected unit lead frames, each unit lead frame having a die paddle, a tie bar for connecting the die paddle to a periphery of the unit lead frame, and a plurality of leads projecting from the periphery toward the die paddle;
a support member patterned into or connected to the periphery of each unit lead frame at a proximal end and bent into a different plane than the leads so that a distal end of each support member is disposed above or below the leads and projects toward the die paddles;
a semiconductor die attached to each of the die paddles;
a mold compound at least partly encapsulating the unit lead frames so that the distal end of each support member is anchored in the mold compound and part of the tie bars remains uncovered by the mold compound, and
wherein the support members are permanently electrically disconnected from the semiconductor dies and the tie bars are detached from the periphery of the unit lead frames outside the mold compound so that the support members hold the unit lead frames in place and the semiconductor dies are electrically isolated from the lead frame strip.

10. The semiconductor strip assembly of claim 9, wherein the support members are bent above the leads and the distal ends of the support members are bent downward toward the die paddles.

11. The semiconductor strip assembly of claim 9, wherein the support members are bent below the leads and the distal ends of the support members are bent upward toward the die paddles.

12. The semiconductor strip assembly of claim 9, wherein the support members comprise the same material as the lead frame strip.

13. The semiconductor strip assembly of claim 9, wherein the support members are formed as a single continuous part of the lead frame strip.

14. The semiconductor strip assembly of claim 9, wherein the support members are coated with an electrical insulator.

15. The semiconductor strip assembly of claim 9, wherein the support members are spaced apart from the die paddles and the leads.

16. The semiconductor strip assembly of claim 9, wherein each unit lead frame includes a pair of support members patterned into or connected to the periphery of the unit lead frame at opposing sides of the periphery.

17. The semiconductor strip assembly of claim 16, wherein the pair of support members patterned into or connected to the periphery of each unit lead frame are offset from one another.

18. A lead frame strip, comprising:
a plurality of connected unit lead frames, each unit lead frame having a die paddle for attaching to a semiconductor die, a tie bar connecting the die paddle to a periphery of the unit lead frame, and a plurality of leads projecting from the periphery toward the die paddle; and
a support member patterned into the periphery of each unit lead frame at a proximal end and bent into a different plane than the leads so that a distal end of each support member is disposed above or below the leads and projects toward the die paddles.

19. The lead frame strip of claim 18, wherein each unit lead frame includes a pair of support members patterned into or connected to the periphery of the unit lead frame at opposing sides of the periphery.

20. The lead frame strip of claim 19, wherein the pair of support members patterned into or connected to the periphery of each unit lead frame are offset from one another.

* * * * *